(12) United States Patent
Spinelli et al.

(10) Patent No.: US 6,214,425 B1
(45) Date of Patent: *Apr. 10, 2001

(54) STORAGE BOX FOR AN OBJECT TO BE PROTECTED AGAINST PHYSICOCHEMICAL CONTAMINATION

(75) Inventors: Philippe Spinelli, La Tronche; Claude Doche, Claix; Jean-Christophe Rostaing, Buc; François Coeuret; Sylvain Scotto D'Apolinia, both of Guyancourt, all of (FR)

(73) Assignees: Commissariat a l'Energie Atomique; L'Air Liquide, both of Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/860,471
(22) PCT Filed: Nov. 19, 1996
(86) PCT No.: PCT/FR96/01828
§ 371 Date: Sep. 29, 1997
§ 102(e) Date: Sep. 29, 1997
(87) PCT Pub. No.: WO97/19464
PCT Pub. Date: May 29, 1997

(30) Foreign Application Priority Data

Nov. 20, 1995 (FR) .................................................. 95 13720

(51) Int. Cl.[7] .............................. B05D 3/04; B65D 23/02; B65D 23/08

(52) U.S. Cl. ............................ 428/35.7; 206/710; 216/37; 216/67; 427/534; 427/539; 427/574; 427/579; 427/585; 428/36.6; 428/36.7; 428/336

(58) Field of Search ............................. 206/710; 427/574, 427/585, 539, 534, 579; 216/37, 67; 428/35.2, 35.7, 336, 412, 451, 36.6, 36.7

(56) References Cited

U.S. PATENT DOCUMENTS

| 4,735,832 | * | 4/1988 | Ichikawa et al. ..................... 428/451 |
| 5,116,665 | * | 5/1992 | Gauthier et al. ..................... 428/216 |
| 5,255,783 | * | 10/1993 | Goodman et al. .................... 206/710 |
| 5,549,205 | * | 8/1996 | Doche ................................. 206/710 |

FOREIGN PATENT DOCUMENTS

| 2 083 049 | * | 3/1982 | (GB) . |
| 63-308920 | * | 12/1988 | (JP) . |

* cited by examiner

*Primary Examiner*—Ellis Robinson
*Assistant Examiner*—Sandra M. Nolan
(74) *Attorney, Agent, or Firm*—Oblon, Spivak, McClelland, Maier & Neustadt, P.C.

(57) ABSTRACT

The invention relates to a storage box for an object that is to be protected from physicochemical contamination. The storage box is intended to have low weight, good mechanical strength, a good electrical condition, with a low degassing rate in time with prevention of diffusion of gasses from the external atmosphere into the interior of the box. The inner and/or outer surface of the box's walls are coated with at least one protective layer. The box may be used to store silicon wafers.

16 Claims, 1 Drawing Sheet

STORAGE BOX FOR AN OBJECT TO BE PROTECTED AGAINST PHYSICOCHEMICAL CONTAMINATION

Figure 1:
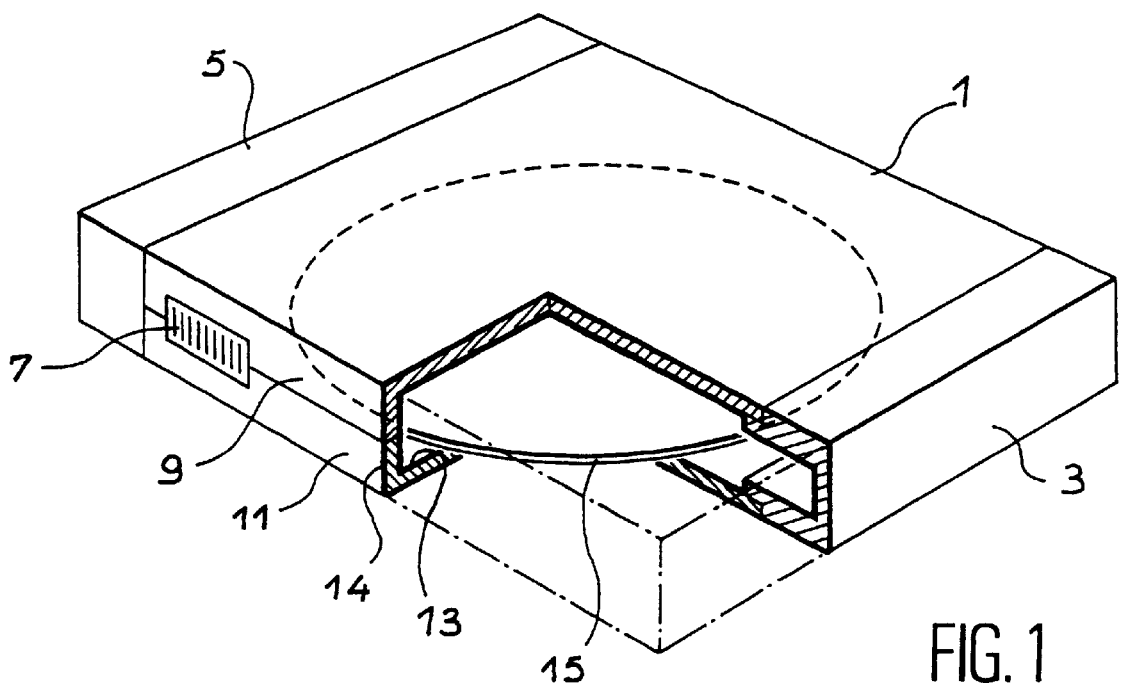

The invention relates to a storage box for an object to be protected against physicochemical contamination.

More specifically, the invention relates to the field of the manufacture of products in an ultra-clean environment. This production uses clean room technology consisting of treating the atmosphere in which the product is produced. In the agroalimentary or pharmaceutical, as well as the microelectronics industries, numerous products are consequently produced in a clean room atmosphere in order to avoid contamination risks. In the microelectronics field, contamination is more particularly feared in the production of parts having very fine geometries and using thin films such as LCD's or sensors and in the manufacture of semiconductor devices, such as microprocessors, static or dynamic memories, etc.

There are essentially two types of contamination, namely particulate contamination and physicochemical contamination.

Particulate contamination is due to a physical deposit on the product produced and which is liable to give rise to physical phenomena. Thus, in the microelectronics field, e.g. on silicon wafers, such deposits can lead to short circuits or to interruptions or disconnections to electrical connections. In this field, the size of the active geometries decreases every year and has passed from a few microns in the 1970's to submicron dimensions at the start of the 1990's. Industrialists now have technical equipment enabling them to manufacture electronic components with geometries of 0.2 to 0.5 $\mu$m. A particulate contamination of such components cannot be avoided by simply using conventional clean room procedures.

Physicochemical contamination can be due to the actual production processes, i.e. cleaning or annealing at high temperatures under a chemically active atmosphere. It can also be due to contact of the produced product with its direct environment by mechanical friction on the product support or by interacting with the surrounding atmosphere, e.g. oxidation during storage between two stages of the process.

In order to avoid contamination, at present two different procedures are used, namely the control of the environment in the manufacturing workshop or the selective control of the environment of the product.

The control of the environment in the manufacturing workshop consists of dealing with all the environmental conditions concerning the production equipment, the products produced and the human operators. This is the most widely used solution. However, due to the presence of the human operator, a source of significant chemical and particulate contamination, this procedure is limited to a cleanness equivalent to class 0.5 to 1. (Class 1 corresponds to the presence of less than one particle, whose diameter exceeds 0.5 $\mu$m per cubic foot: Federal standard 209c, "Airborne Particulate Cleanliness Classes in Clean Rooms and Clean Zones"). The quality of such an environment is difficultly compatible with the manufacture of films having geometries lower than 0.20 $\mu$m.

Moreover, in such a manufacturing workshop where all the atmosphere is controlled, the manufactured product is generally transported in a box or container ensuring a good protection against particulate contamination, but a mediocre seal with respect to the surrounding atmosphere. Therefore the gas of the workshop atmosphere, polluted by the human operator, tends to diffuse through the wall of the container or box and leads to a high chemical contamination.

The selective control of the environment of the product consists of solely optimizing the conditions around the manufactured product. In this case, the product is placed within a container, whose internal atmosphere is free from particulate contamination. The advantage of this solution is that it is theoretically possible to arrive at a system complying with the best possible specifications as regards chemical contamination, because the manufactured product is no longer in contact with the surrounding air and the human operator is then no longer a particulate and chemical contamination source. The control of the environment of the product during the transportation and storage phases taking place during its manufacturing process is consequently made much easier and the chemical contamination is then mainly dependent on the impermeability performance characteristics of the container.

In the microelectronics field and in the manufacture of silicon wafers, this solution is known as standard mechanical interface or SMIF.

FR 2 697 000 also envisages producing a flat, active confine box controlling the environment of the product during the open and storage phases of said box. More specifically, said box is equipped with an aeraulic unit having a diffuser issuing into the interior of the box and which can be connected to an inert gas, e.g. nitrogen supply means.

In the microelectronics field, the storage box for a product such as a silicon wafer must comply with the following specifications:

low unit production cost, impossibility of using polluting materials, such as e.g. aluminium, iron or stainless steel, good electrical conduction to obviate problems associated with static electricity discharges through the transported product, low degassing rate in time, easy cleaning, good mechanical strength and low weight permitting human handling.

In order to comply with these requirements, virtually all storage boxes are manufactured from plastics, e.g. polycarbonate or polypropylene. Although these materials comply with the above requirements, it has been found that they do not meet the future requirements as regards the permeability of contaminating agents, whose diffusion through plastics material is fast, even at ambient temperature.

The object of the invention is to develop a storage box meeting the aforementioned specifications and solving the problems of the prior art. It therefore relates to a storage box for an object to be protected against physicochemical contamination. The walls of said box are made from a plastics material.

According to the characterizing part of the invention, the inner surface and/or outer surface of the walls of said box is coated with at least one protective layer of a material having the general formula:

$$SiO_xN_yH_t,$$

where t is lower than x and/or y and x and y are preferably in the following ranges:

$$0 < x < 2$$

$$0 \leq y < 0.4$$

Preferably, x is in the range 0.3 to 1.8.

The contribution of hydrogen to the composition $SiO_xN_yH_t$ will usually be very low, essentially coming from the gaseous precursor of the silicon used for performing the deposit, which is in general a molecule containing hydrogen. Therefore, in all cases t is less than at least one of the parameters x, y and x only in the case where y is zero (no nitrogen contribution to the material).

As a result of the characteristics of the invention, a storage box is obtained in which the chemical contamination resulting from the diffusion of gases through the plastic material wall is very significantly reduced.

In the case where deposition takes place on the inner wall of the box, the organic chemical contamination due to the degassing of the plastics material walls towards the inside of the box kept under a vacuum is reduced. There is also an improvement to the surface state of the interior of the box and its cleaning is facilitated. There is also an improvement to the mechanical strength of the inner surface of the thus treated box and a reduction of the particulate contamination mechanically produced by impacts or scratches.

Preferably, the protective layer is deposited on said surface or surfaces of the box by plasma enhanced chemical vapour deposition (PECVD). This procedure makes it possible to make homogeneous deposits of limited thickness on a plastics material. The thickness of the protective layer is advantageously at least 0.1 $\mu$m. The minimum thickness of the layer is imposed on the one hand by specifications linked with permeation and on the other by the need for a mechanical strength.

According to an advantageous embodiment of the invention, the thickness of the layer is equal to or greater than 1 $\mu$m and is preferably in the range 2 to 3 $\mu$m.

Plasma enhanced chemical vapour deposition methods are described in FR 2 631 346, EP 502 790 and EP 519 784.

The reactor and processes described in these patents were developed in order to obtain high density layers (little or no columnar or granular structures) operating at quasi-ambient temperature. Thus, if a plastics material such as polycarbonate only undergoes irreversible modifications as from 115 to 120° C., the inorganic layer will generally be cracked and/or delaminated well before said limit due to the very high thermal stresses applied to the interface as a result of the significant asymmetry of the expansion coefficients (ratio 10 to 20). Therefore working at substrate temperatures above 60° C. is avoided.

Use is generally made of high density plasmas and in most cases it is necessary to cool the surface of the storage box element on which deposition takes place, by keeping the box holder (in contact with the face opposite to the deposit) at a temperature of approximately 10 to 20° C.

Another important aspect of such processes is the control of the ion bombardment of the substrate. As working takes place at low temperatures, it is necessary to supply non-thermal energy in the form of a kinetic impact of the ions in order to assist the migration and rearrangement of atoms condensing on the surface. Only under this condition is it possible to obtain dense microstructure layers offering good functional properties (hardness, physicochemical inertia, impermeability, etc.).

Finally, the adhesion of the inorganic layers to the storage box must be excellent for all applications of thus protected polymers. In the present case, the box must be periodically cleanable in a liquid ultrasonic bath throughout its life. This is a very severe criterion. The process described in FR 2,631,346 makes it possible to produce coatings, which have a remarkable resistance to ultra-sonic cleaning. This process consists of a succession of an argon plasma, a 10% ammonia plasma in argon and then a highly helium-diluted silane plasma.

Research carried out by the applicants have revealed that the storage boxes with coatings produced by the processes described in FR 2,631,346, EP 502 790 and EP 519 784 have traces of organic contamination liable to deteriorate the surface of the object (e.g. a silicon wafer) stored in such a box. However, this contamination is localized in the surface layer of the protective coating. It is essentially due to the interaction of high energy species of the plasma with the polymer substrate, whose characteristic organic functions in the carbon surface layer can be identified.

As a function of the stage considered in the preparation of the object to be stored (e.g. during multiple stages intervening in the manufacture of a semiconductor device), said organic contamination can definitely have a very prejudicial effect. For a better understanding of such phenomena reference can e.g. be made to the publication of W. Vandervorst et al. in "Proceedings of the 2nd International Symposium on Ultra Clean Processing of Silicon Surfaces, Leuven, Belgium, September 1995".

The applicants considered it significant to have a method making it possible to bring about the removal of said surface carbon contamination. Supplementary research carried out for providing a technical solution to this problem has demonstrated that it is possible to achieve such a result by performing a plasma etching stage, preferably immediately following the above-described $SiO_xN_yH_t$ coating deposition phase and in the same reactor.

The invention also relates to a process for the treatment of a storage box of an object which is to be protected against physicochemical contamination, whose walls are made from a plastic material and according to which the deposition takes place on the inner surface and/or the outer surface of its walls of at least one protective layer made from a material of formula $SiO_xN_yH_t$, in which t is lower than x and/or y, by a PECVD procedure, x and y preferably being respectively in the ranges $0<x<2$ and $0 \leq y<0.4$. More preferably, x is in the range 0.3 to 1.8.

According to one of the variants of the invention, this is followed by a surface etching of the previously deposited protective layer, by contacting the box with a plasma of a gaseous mixture based on oxygen and a fluorine gas, the latter being advantageously chosen from among $SF_6$ and $NF_3$.

As there is no selectivity constraint, conditions are adopted giving the highest etching speed. Information can be obtained in this connection from the literature concerning $SF_6$ plasma etching of $SiO_2$. In this case, the etching is not spontaneous and requires a bombardment of the surface by accelerated ions from the plasma. This effect is obtained in the same way as in the case of the process for the deposition of the layers, by applying to the metal substrate holder on which rests the rear face of the element of the polycarbonate storage box and on which the etching operation takes place, a radio frequency biasing of typically 13.56 MHz. As a result of self-biasing, there is a continuous negative potential difference between the plasma and the surface of the sample.

Specifically, the results available in the literature with respect to $SiO_2$ etching by $SF_6$, show that a maximum etching speed is obtained for partial pressures of $SF_6$ of 1 to 10 millitorr (0.13 to 1.3 Pa), with an ion energy of approximately 100 eV. It is not therefore appropriate to work under conditions where said energy is significantly higher.

The partial oxygen pressure in the etching mixture can be chosen within a relatively wide range without moving far away from the optimum conditions. The problem of the oxidation of the polycarbonate (browning risk) does not arise here, because the box is already covered with silica.

The higher the oxygen concentration in the mixture, the higher the etching speed. An oxygen concentration in the range 10 to 80% is suitable in most cases.

Experience has shown that the $SF_6/O_2$ plasma has an excellent efficiency for etching the surface layer, which is a mixture of $SiO_2$ or $SiO_x$ and organic fractions.

It is preferable to provide a means for controlling the etched depth in order to only remove the carbon surface layer thickness. To this end, it is possible to adjust the etching speed and stop the treatment after a fixed time (for safety reasons significantly increased compared with the nominal value, which leads to an over-etching). It is also possible to make the process dependent on an end of etching detection means, e.g. an in situ optical measurement.

Tests were performed in the surface wave microwave reactor described in FR 2 677 841. In this type of reactor, whose special feature is that the substrate is in the very near post-discharge, it is not indicated to directly inject $SF_6$ into the surface wave tube. In a halogen medium, the energy microwave field of the surface wave gives rise to an extremely fast etching phenomenon with respect to the silica tube wall (much faster than for a silica sample placed in the homogeneous plasma in the centre of the tube). This etching rapidly leads to a devitrification, which can deteriorate the mechanical strength in vacuo of the reactor.

As a consequence, the surface wave discharge is only maintained in a mixture of oxygen and argon. The latter facilitates the control of the extension of the plasma throughout the tube volume. $SF_6$ is injected in post-discharge in the vicinity of the sample. With sufficiently high microwave powers, it is possible to obtain a very high plasma density permitting an effective dissociation of the $SF_6$ and adequate active halogen species concentrations (particularly atomic fluorine) in the vicinity of the substrate.

The process parameters are then typically as follows:

microwave power: 400 watts continuous self-biasing of the substrate holder with respect to earth: −100 V total pressure: 70 millitorr (9.1 Pa)

Ar flow rate: 125 cm³ standard/minute

Ar flow rate: 50 cm³ standard/minute $O_2$ flow rate: 50 cm³ standard/minute $SF_6$ flow rate: 50 cm³ standard/minute.

The etching speed obtained is typically approximately 100 nanometres/minute. The carbon surface layer removal operation consequently takes less than one minute on average.

As will be clear to the expert, the choice of the reactor used for performing the deposition of the $SiO_xN_yH_t$ layer or layers or for carrying out the etching of the organic contamination is important.

Apart from the reactor examples already given, it is pointed out that it is possible to carry out the deposition or etching using a radio frequency reactor of the planar diode type, like that described in JP-05/202211, or in a microwave reactor based on an applicator of the leak guide type, like that described in U.S. Pat. No. 4,893,584, or also in certain plasma reactors especially adapted to the treatment of substrates with a size significantly exceeding 10 cm² and possibly having an awkward shape, such as reactors based on the microwave plasma excitation concept using uniformly distributed electron cyclotron resonance (UDECR), like that described in EP-A-496 681.

Reference can also be made to the research relating to PECVD production of amorphous silica layers of very great uniformity in such a UDECR-type reactor, reported in the article by J. C. Rostaing et al., published in Proc. Int. Conf. on Metallurgical Coatings and Thin Films, San Diego, Calif., U.S.A., Apr. 24–28, 1995.

The invention is described in greater detail hereinafter relative to non-limitative embodiments and the attached drawings, wherein show:

FIG. 1 A storage box according to the invention.

Figure 2:
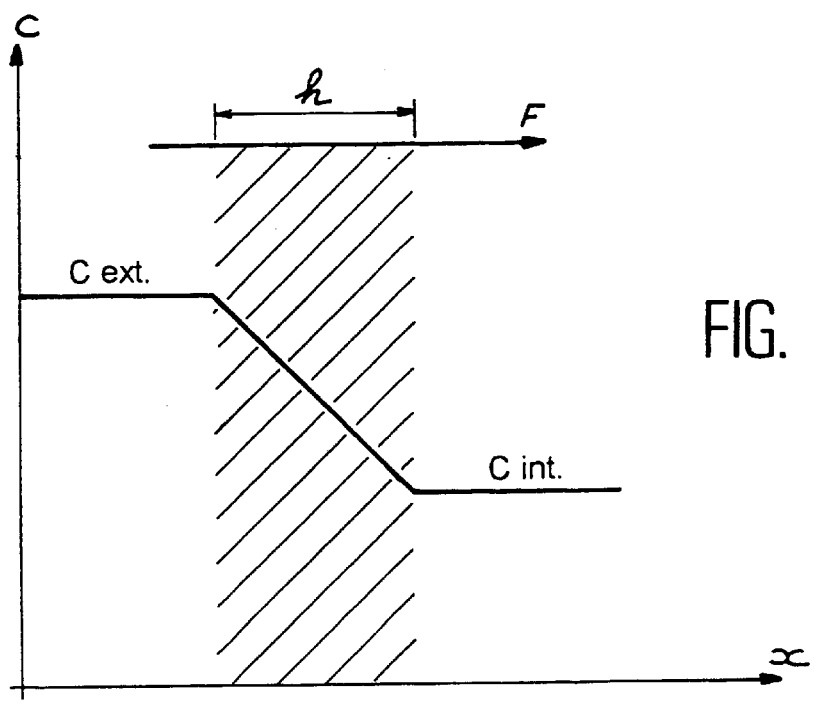

FIG. 2 A graph illustrating the variation of the oxygen concentration outside and inside a box according to the invention.

An embodiment of the invention will now be described. As illustrated in FIG. 1, the storage box according to the invention comprises a body 1, a door 3 and optionally an aeraulic unit 5 making it possible to diffuse an inert gas into the interior of the volume of the box and an identification code 7 giving information regarding the contents of said box. The body 1 is advantageously formed by two U-shaped half-shells 9, 11 made from a plastics material, e.g. polycarbonate or polypropylene with a thickness of 2 mm.

The protective layer 13, 14 is respectively deposited on the inner and outer walls of the box 1 prior to the assembly of the two half-shells 9, 11. These two half-shells are e.g. assembled with an epoxy resin adhesive or are welded, with the exception of the aeraulic unit 5, which is fitted onto the remainder of the box 1. The deposition of the protective layer 13 also takes place on blocking elements and carrying the object 15 within the box, e.g. wedges or rods (the latter not being shown in FIG. 1), but such elements are in any case optional.

For illustration purposes, a storage box intended to contain a silicon wafer of diameter 200 mm and thickness 725 mm has the following approximate dimensions:

External dimensions:

length: 240 mm width: 240 mm thickness: 19 mm

Internal dimensions:

length: 230 mm width: 210 mm thickness: 9 mm

The deposition of the protective layer 13 takes place on the inner walls of the half-shells 9, 11 forming the box, using a UDECR reactor such as is described in the aforementioned publication of J. C. Rostaing et al. This reactor makes it possible to deposit a fine film of silicon oxide and/or nitride and/or oxynitride from a microwave plasma excited at the frequency 2.45 GHz. This reactor is supplied with the following precursor gases:

for silicon: silane ($SiH_4$), $Si_2H_6$ or $Si_3H_8$ or halosilanes $SiX_nH_{4-n}$, (with X representing chlorine or fluorine and $n \leq 4$), for oxygen: $O_2$, for nitrogen: $N_2$, $NH_3$ or $N_2O$.

The pressure within the reactor is below 10 mTorr (1.33 Pa). The substrate surface temperature does not exceed 100° C., so as not to bring about a deterioration of the surface qualities thereof. The adhesion qualities of the protective layer 13 to the surface of the plastics material box 1 can be improved by a prior exposure of said surface to an argon plasma, e.g. such a pretreatment being described in FR-A-2 631 346.

Table 1 is a typical example of the criteria required in order to obtain the necessary box coating performance characteristics.

TABLE 1

| Characteristics | | Standards |
|---|---|---|
| Permeability to $O_2$ | $<10^{-15}$ cm$^2$/s | |
| Surface resistance | $<10^9$ $\Omega/^2$ | ASTM D-257 |
| Electrostatic discharge | $<3s$ | MIL B-81705B |
| Roughness:Ra | $<0.2$ $\mu$m | |
| Tensile/shear strength | $>1$ N/mm$^2$ | |
| Transmittance | $>75\%$ | ASTM D-1003 |
| Inactinic properties | cutoff at 0.45 $\mu$m | |
| Knoop hardness (load 0.1 kg) | 200 N/mm$^2$ | |
| Vickers hardness | 120 N/mm$^2$ | |
| Thickness | $<10$ $\mu$m | |
| Life | 5 years | |

FIG. 2 illustrates the contamination observed by gaseous diffusion through the walls of a standard silicon wafer storage box at ambient temperature. The abscissa x represents the thickness direction of the wall, h the thickness of the box wall and C the polluting element concentration.

According to the first law of Fick (cf. "Procédés de séparation par membrane", J. P. Brun, Paris XII University, Masson, 1989), the material flux F passing through the storage box wall is given by the following formula: F=−Div C, or per unit section F=−D.dC/dx, D representing the diffusion coefficient.

Assuming that the concentration change remains very low in the box and consequently does not affect the equilibrium of the concentrations in the thickness of the wall, it can be considered that the internal concentration ($C_{int}$) is well below the external contamination ($C_{ext}$). It can therefore be estimated per section unit F=−D$\Delta$C/$\Delta$x.

The concentration variation within the time internal t within a box is given by the reentering flux F per section unit S, divided by the container volume, namely: $C_{int}$=F.S/V.t.

Moreover, on the basis of the starting hypothesis that the considered contaminant is the oxygen contained in the external air ($C_{ext}$≈21%) and that at t=0 the oxygen concentration $C_{O_2}$ on the box inner wall is zero, it can be considered that the oxygen concentration in the box at the end of a time t is given by the following expression:

$$C_{O_2}=C_{ext}.S.D.t/V.h$$

in which S represents the total surface of the inner walls of the box, D represents the diffusion coefficient of oxygen in the considered material at a given temperature, V represents the box volume and h represents the thickness of the walls.

Two numerical examples illustrating the advantages of the invention will now be given.

1) COMPARATIVE EXAMPLE

Polycarbonate Box Without Protective Layer $D=21.10^{-9}$ cm$^2$.s$^{-1}$, (at 300 K), $V=320$ cm$^3$, $S=800$ cm$^2$.

$h=0.2$ cm, $C_{ext}=21\%$.

With the above values and applying the preceding formula, an oxygen concentration in the box after one second is $$C_{O_2}=0.21\times800\times21\times10^{-9}/320\times0.2=55\cdot10^{-9} \text{ or 55 ppb.}$$

The chemical purity specification in a box compatible with a 1 Gbyte memory production technology must be just below 50 ppb. Thus, this value is reached after only one second, which means that a conventional polycarbonate box is not compatible with the specifications required in the future for microelectronics technologies.

2) EXAMPLE

Polycarbonate Box Covered With a 1 $\mu$m Thick Silicon Oxide Protective Layer

In this case, the diffusion coefficient D of oxygen in silicon oxide is given by the extension of the Fick equation, i.e. D=$D_o$.e-E/kT, which E represents the oxygen activation energy in silicon oxide, i.e. in this case 1.16 eV, $D_o$ represents the oxygen diffusion constant in silicon oxide and is equal to $2.7\cdot10^{-4}$ cm$^2$/s and k represents the Boltzman constant ($8.62\cdot10^{-5}$ eV/° K), which means at ambient temperature:

$$D_{300°\ K}=2.7\cdot10^{-4}.e\text{-}(1.16/8.62\cdot10^{-5}.300)=10^{-23} \text{ cm}^{-2}/s.$$

Using the other numerical values of the comparative example, the concentration in the box after one second and only considering the oxygen diffusion through the single, 1 $\mu$m thick silicon oxide layer (h=1 $\mu$m) is:

$$C_{O_2}=C_{ext}.S.D.t/V.h$$

$$C_{O_2}=0.21.800.10^{-23}/320.10^{-4}=5.25\cdot10^{-20} \text{ after one second.}$$

Thus, for a polycarbonate container coated with a 1 $\mu$m thick silica deposit, the 50 ppb specification will be obtained after approximately $10_{11}$ s, i.e. after approximately 3000 years.

However, in practice, the silicon oxide layers deposited by CVD plasma at ambient temperature contain defects giving rise to faster diffusion conditions. However, there is a considerable margin for maintaining within the requisite performance range, i.e. maintaining the specification of 50 ppb for a few minutes to a few hours, or a few days or even a few weeks if necessary.

The reasoning and orders of magnitude are identical with boxes covered with a layer of silicon nitride or silicon oxynitride, which can be deposited at low temperatures and which also constitute very good diffusion barriers against oxygen. In the same way, these different protective layers prevent the diffusion into the box of any other atomic compound or molecule contained in air, such as e.g. water vapour.

What is claimed is:

1. A storage box for an object to be protected against physiocemical contamination, wherein the walls comprise a plastics material and the inner surface and/or outer surface of the walls is/are coated with at least one protective layer consisting essentially of a material formula $SiO_xN_yH_t$, where t<x+y, when x>0 and y>0; t<x, when y=0; and x>y when y=0, obtained by depositing said protective layer by plasma enhanced chemical vapor deposition wherein the source of silicon is a gaseous source of silicon, followed by surface etching the deposited protective layer by contacting the box with a plasma of a gaseous mixture comprising oxygen and fluorine, thereby removing surface carbon contamination wherein said box is substantially impermeable to $O_2$.

2. The storage box according to claim 1, wherein x is higher than 0 and lower than 2.

3. The storage box according to claim 1, wherein y is equal to or higher than 0 and lower than 0.4.

4. The storage box according to claim 1, wherein the thickness of the protective layer is at least 0.1 $\mu$m.

5. The storage box according to claim 2, wherein the thickness of the protective layer is at least 0.1 μm.

6. The storage box according to claim 3, wherein the thickness of the protective layer is at least 0.1 μm.

7. The storage box according to claim 4, wherein the thickness of the protective layer is at least 1 μm.

8. The storage box according to claim 5, wherein the thickness of the protective layer is at least 1 μm.

9. The storage box according to claim 6, wherein the thickness of the protective layer is at least 1 μm.

10. The storage box according to claim 4, wherein the thickness of the protective layer is between 2 and 3 μm.

11. The storage box according to claim 5, wherein the thickness of the protective layer is between 2 and 3 μm.

12. The storage box according to claim 6, wherein the thickness of the protective layer is between 2 and 3 μm.

13. The storage box according to claim 1, wherein the walls comprise polycarbonate or polypropylene.

14. The storage box according to claim 1, further comprising an aeraulic unit.

15. The storage box according to claim 1, containing at least one silicon wafer.

16. A process for the production of the storage box according to claim 1, comprising depositing the protective layer on the surface or surfaces of the box walls by plasma enhanced chemical vapor deposition and surface etching the deposited protective layer by contacting the box with a plasma of a gaseous mixture comprising oxygen and a fluorine gas selected from the group consisting of $SF_6$ and $NF_3$.

* * * * *